(12) United States Patent
Wu et al.

(10) Patent No.: US 12,237,009 B2
(45) Date of Patent: Feb. 25, 2025

(54) SENSE AMPLIFIER CIRCUIT, MEMORY CIRCUIT, AND SENSING METHOD THEREOF

(71) Applicant: Taiwan Semiconductor Manufacturing Company, Ltd., Hsinchu (TW)

(72) Inventors: Jui-Jen Wu, Hsinchu (TW); Jen-Chieh Liu, Hsinchu (TW); Yi-Lun Lu, New Taipei (TW); Win-San Khwa, Taipei (TW); Meng-Fan Chang, Taichung (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 150 days.

(21) Appl. No.: 17/846,035

(22) Filed: Jun. 22, 2022

(65) Prior Publication Data

US 2023/0420041 A1 Dec. 28, 2023

(51) Int. Cl.
*G11C 11/00* (2006.01)
*G11C 11/418* (2006.01)
*G11C 11/419* (2006.01)

(52) U.S. Cl.
CPC .......... *G11C 11/419* (2013.01); *G11C 11/418* (2013.01)

(58) Field of Classification Search
CPC .............................. G11C 11/419; G11C 11/418
USPC ......................................................... 365/154
See application file for complete search history.

(56) References Cited

U.S. PATENT DOCUMENTS

| | | | | |
|---|---|---|---|---|
| 4,743,784 A | * | 5/1988 | Obara | G11C 7/065 327/213 |
| 5,289,419 A | * | 2/1994 | Hashizumi | G11C 11/419 365/207 |
| 6,232,800 B1 | * | 5/2001 | Hirairi | G11C 7/1006 327/55 |
| 6,480,037 B1 | * | 11/2002 | Song | G11C 7/065 327/55 |
| 6,618,307 B2 | * | 9/2003 | Wickman | G11C 7/065 365/207 |
| 7,345,937 B2 | * | 3/2008 | Yoon | G11C 11/4097 365/205 |
| 7,773,431 B2 | * | 8/2010 | Avramescu | G11C 7/12 365/189.08 |
| 8,208,331 B2 | * | 6/2012 | Lin | G11C 11/412 365/189.11 |

(Continued)

*Primary Examiner* — Viet Q Nguyen
(74) *Attorney, Agent, or Firm* — JCIPRNET

(57) ABSTRACT

The sense amplifier circuit includes a differential amplifier, a first switch, and a second switch. The differential amplifier includes a first input node, a second input node, a first output node, and a second output node. The differential amplifier amplifies a voltage difference of the first output node and the second output node according to a first input voltage of the first input node and a second input voltage of the second input node. A control node of the first (second) switch is coupled to a control line, the first (second) switch is coupled to the first (second) input node, and the first (second) switch is coupled to the first (second) output node. The first (second) switch pre-charges the first (second) input node by a first (second) output voltage of the first (second) output node while the control line is received a select signal.

20 Claims, 12 Drawing Sheets

400

(56) References Cited

U.S. PATENT DOCUMENTS

| | | | | |
|---|---|---|---|---|
| 8,848,474 | B2* | 9/2014 | Singh | G11C 11/419 |
| | | | | 365/207 |
| 9,087,558 | B2* | 7/2015 | Shin | G11C 11/4099 |
| 9,881,655 | B2* | 1/2018 | Katoch | G11C 7/062 |
| 9,997,238 | B2* | 6/2018 | Upputuri | G11C 7/067 |
| 10,734,039 | B2* | 8/2020 | Chang | G11C 11/1693 |
| 10,902,889 | B2* | 1/2021 | Oak | G11C 7/08 |
| 11,238,908 | B2* | 2/2022 | Tsai | G11C 7/18 |
| 11,295,789 | B2* | 4/2022 | Kenyon | G11C 7/08 |
| 2010/0172198 | A1* | 7/2010 | Gautam | G11C 7/065 |
| | | | | 365/207 |
| 2014/0192603 | A1* | 7/2014 | Singh | G11C 7/065 |
| | | | | 365/207 |
| 2022/0406386 | A1* | 12/2022 | Chen | G11C 7/065 |
| 2023/0087074 | A1* | 3/2023 | Lo Giudice | G11C 16/28 |
| | | | | 365/185.25 |

\* cited by examiner

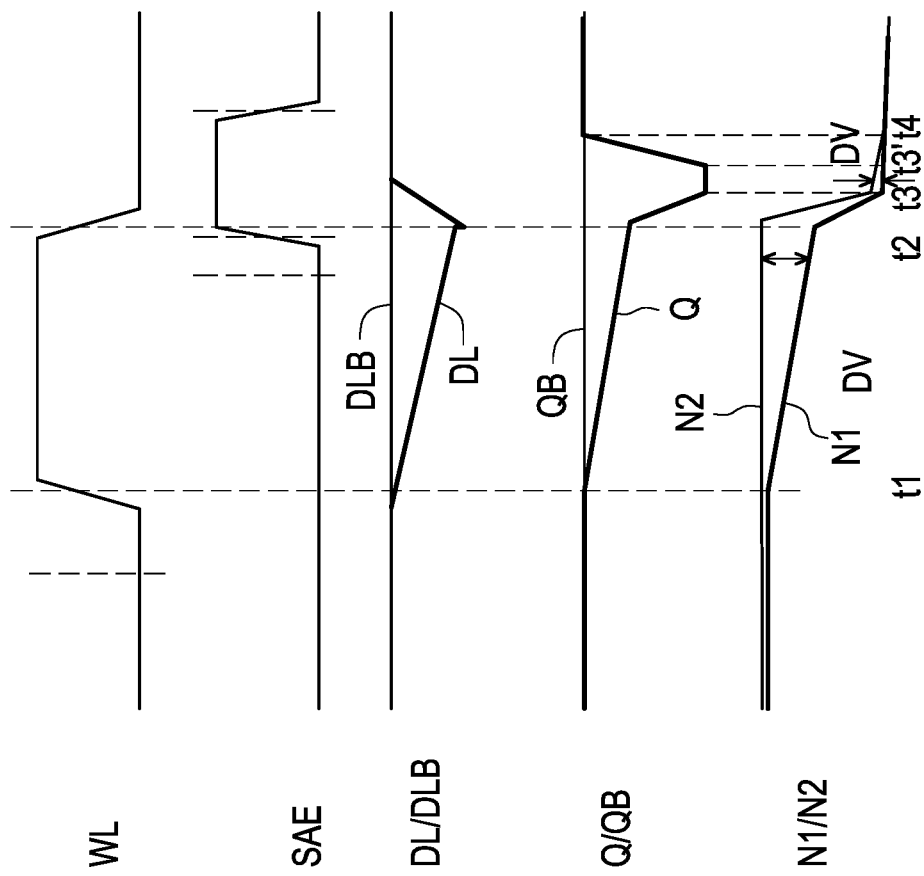

SENSE AMPLIFIER CIRCUIT, MEMORY CIRCUIT, AND SENSING METHOD THEREOF

BACKGROUND

New semiconductor applications are ever changing our lives, from new smartphones, to healthcare, factory automation and artificial intelligence. The operation of the sense amplifier circuit used in the memory circuit plays an important role in enabling these technologies, and has drawn considerable interest along with advances in computing architectures and semiconductor technologies. Currently, there are still rooms for further improving the sensitivity and the sensing speed of the sense amplifier circuit in a given memory array circuit.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 4B is a timing diagram of the sense amplifier circuit shown in FIG. 4A in the operation process according to some embodiments of the present disclosure.

DETAILED DESCRIPTION

Figure 1A:
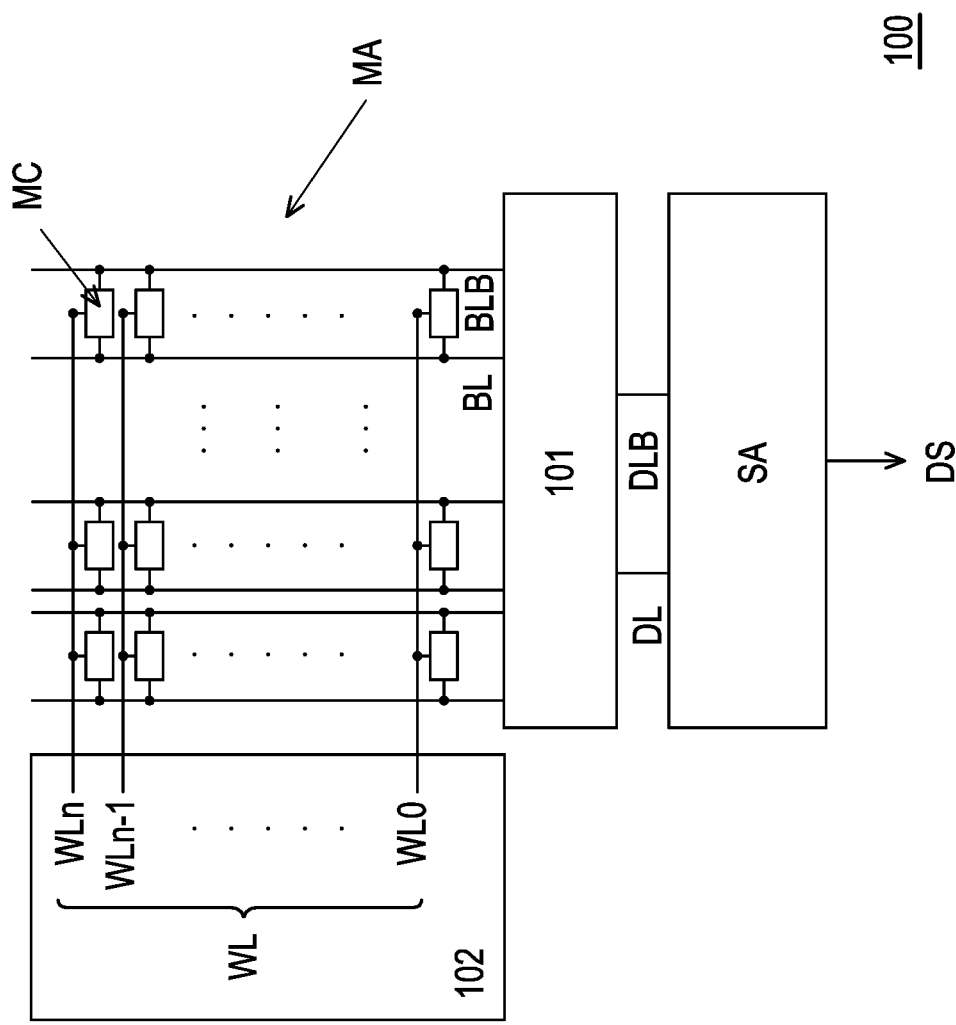
FIG. 1A is a schematic diagram illustrating a memory circuit in accordance with some embodiments of the present disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third", "fourth" and the like, may be used herein for ease of description to describe similar or different element(s) or feature(s) as illustrated in the figures, and may be used interchangeably depending on the order of the presence or the contexts of the description.

The sense amplifier suffers from slow read speed and large offset voltage due to device mismatch. By minimizing the offset voltage of the sense amplifier, the read developing time of the bit-line can be reduced and the read latency of the bit-line can be reduced as well.

In order to keep the offset of the sense amplifier in the allowable margin, the sense amplifier suffers from the problems with slower read speed and higher read fail probability. On the other hand, the bit-line developing time needs to be long enough to get higher read margin for voltage difference sensing. However, the longer bit-line developing time leads to the increasing of the read time. Thus, an offset of the sense amplifier requires more tolerant margin to detect the voltage difference and then achieves faster read speed. That is, an offset tolerant and latch type sense amplifier is required for sensing a memory with small read margin so as to achieve the faster read speed.

Figure 1B:
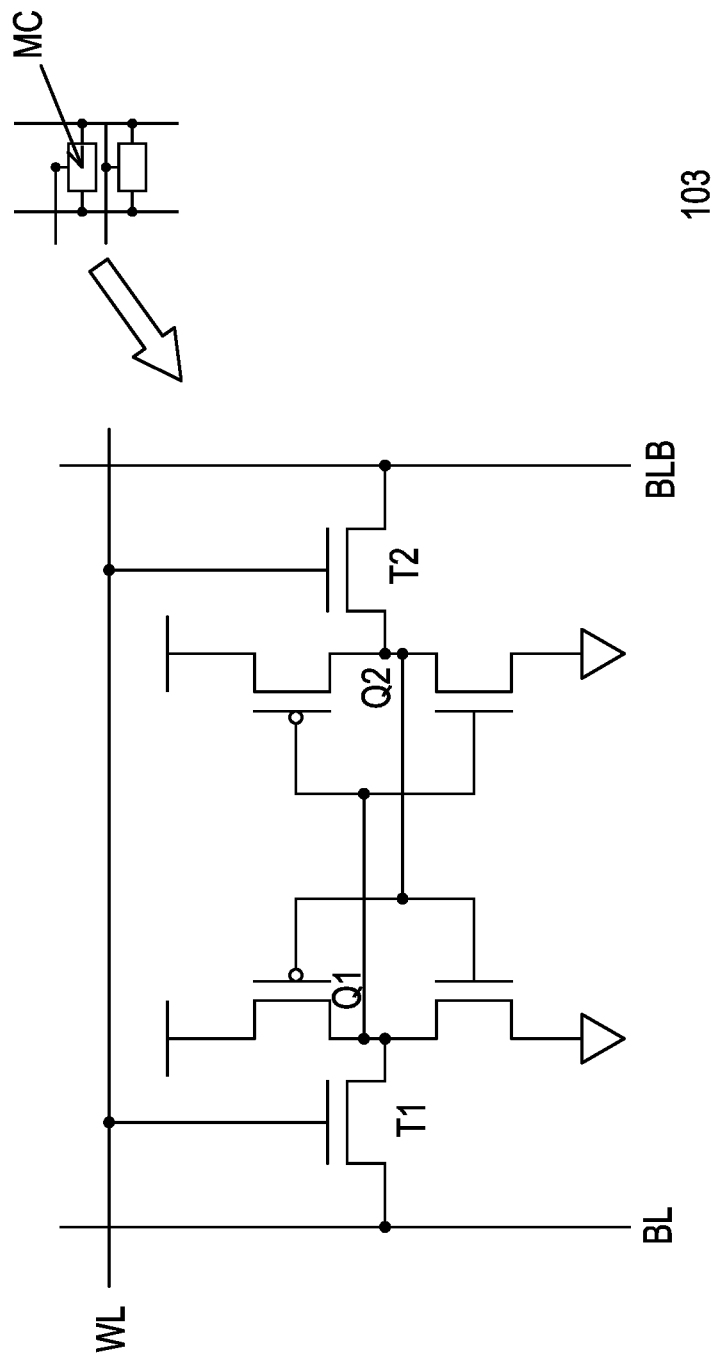
FIG. 1B is a schematic diagram illustrating a memory cell in the memory circuit as shown in FIG. 1A in accordance with some embodiments.

FIG. 1A is a schematic diagram illustrating a memory circuit in accordance with some embodiments of the present disclosure. FIG. 1B is a schematic diagram illustrating a memory cell in the memory circuit as shown in FIG. 1A in accordance with some embodiments.

Referring to FIG. 1A and FIG. 1B, the memory circuit 100 includes memory arrays MA, a column decoder 101, a word line decoder 102, and a sense amplifier SA. The memory arrays MA include memory cells MC, word lines WL, and bit lines BL, BLB. Each memory cells MC includes at least one access transistor (not shown). The word lines WL (i.e., $WL0, \ldots, WL_{n-1}, WL_n$) are respectively coupled to a row of the memory cells MC. The bit lines BL, BLB are respectively coupled to a column of the memory cells MC.

The sense amplifier SA is coupled to the column decoder 101 through a first data line DL and a second data line DLB.

Referring to FIG. 1A and FIG. 1B, the column decoder 101 is used to select the voltage signals from the bit lines BL, BLB and output the decoded voltage signals to the first data line DL and the second data line DLB. The word line decoder 102 is used to select the word lines WL. The sense amplifier SA is used to detect a voltage difference between the bit lines BL, BLB. The voltage signals of the bit lines BL, BLB are transmitted to the column decoder 101 and then the voltage signals of the bit lines BL, BLB are decoded to be data signals. The decoded data signals on the first data line DL and the second data line DLB may lead to a voltage difference between the first data line DL and the second data line DLB, and then the voltage difference between the first data line DL and the second data line DLB will be transmitted to the inputs of the sense amplifier SA. The sense amplifier SA senses the voltage difference between voltage inputs through the first data line DL and the second data line DLB and then outputs a sensing voltage at an output node of the sense amplifier circuit related to the read data.

Referring to FIG. 1A and FIG. 1B, in the exemplary embodiment, the bit lines BL, BLB are attached (electrically coupled) to the sense amplifier (sense amplifier circuits) SA at the edge of the memory array MA. In some embodiments, the bit lines BL, BLB are attached (electrically coupled) to the column decoder 101, and the sense amplifier SA is attached (electrically coupled) to the column decoder 101 through the data lines, for example, the first data line DL and the second data line DLB. As shown in FIG. 1A, the memory cells MC located in the same column may be electrically coupled to the sense amplifier SA using two complementary bit lines BL, BLB.

In some embodiments, the sense amplifier SA is configured to compare voltages on the associated bit lines BL, BLB, and output a read signal indicating the data stored in a selected memory cell MC during a read operation. In addition, the amplification and readout functions are integrated as one circuit in each of the sense amplifier SA. In such embodiment, the memory cells MC in the memory arrays MA are for example, static random access memory (SRAM) type memory cells. In some embodiments, the memory cells MC in the memory arrays MA are a series of 6T-SRAM 103. The 6T-SRAM 103 is the SRAM structure of this embodiment, and those who use this embodiment can adjust the number of transistors in the SRAM according to their needs, so as to realize the function of the SRAM. However, the disclosure is not limited thereto.

Moreover, the memory cells MC may further include an access transistor T1. A gate terminal of the access transistor T1 is connected to a word line WL. In addition, a source/drain terminal of the access transistor T1 is coupled to a storage node Q1, while the other source/drain terminal of the access transistor T1 is connected to bit line BL. When the access transistor T1 is enabled, the bit line BL can charge/discharge the storage node Q1, or vice versa. Accordingly, logic data can be programmed to the storage node Q1, or read out from the storage node Q1. On the other hand, when the access transistor T1 is in an off state, the storage node Q1 is decoupled from the bit line BL, and logic data cannot be written to or read out from the storage node Q1. In other words, the access transistor T1 may control access of the storage node Q1.

Similarly, access of the storage node is controlled by an access transistor T2. The word line WL for controlling switching of the access transistor T1 may also connect to a gate terminal of the access transistor T2. In this way, the access transistors T1, T2 may be switched simultaneously. In addition, a source/drain terminal of the access transistor T2 is coupled to a storage node Q2, while the other source/drain terminal of the access transistor T1 is connected to a bit line BLB. When the access transistor T2 is enabled, the bit line BLB can charge/discharge the storage node Q2, or vice versa. Accordingly, logic data can be programmed to the storage node Q2, or read out from the storage node Q2. On the other hand, when the access transistor T2 is in an off state, the storage node Q2 is decoupled from the bit line BLB, and logic data cannot be written to or read out from the storage node Q2. During a write operation, the bit lines BL, BLB may receive complementary logic data, in order to overwrite the logic data previously stored at the storage nodes Q1, Q2. In addition, during a read operation using the sense amplifier SA, both of the bit lines BL, BLB are pre-charged, and one of them is slightly pulled down by the corresponding storage node. By comparing voltage difference of the bit lines BL, BLB, the logic data stored at the storage nodes Q1, Q2 can be read out easily using the sense amplifier SA.

Figure 2A:
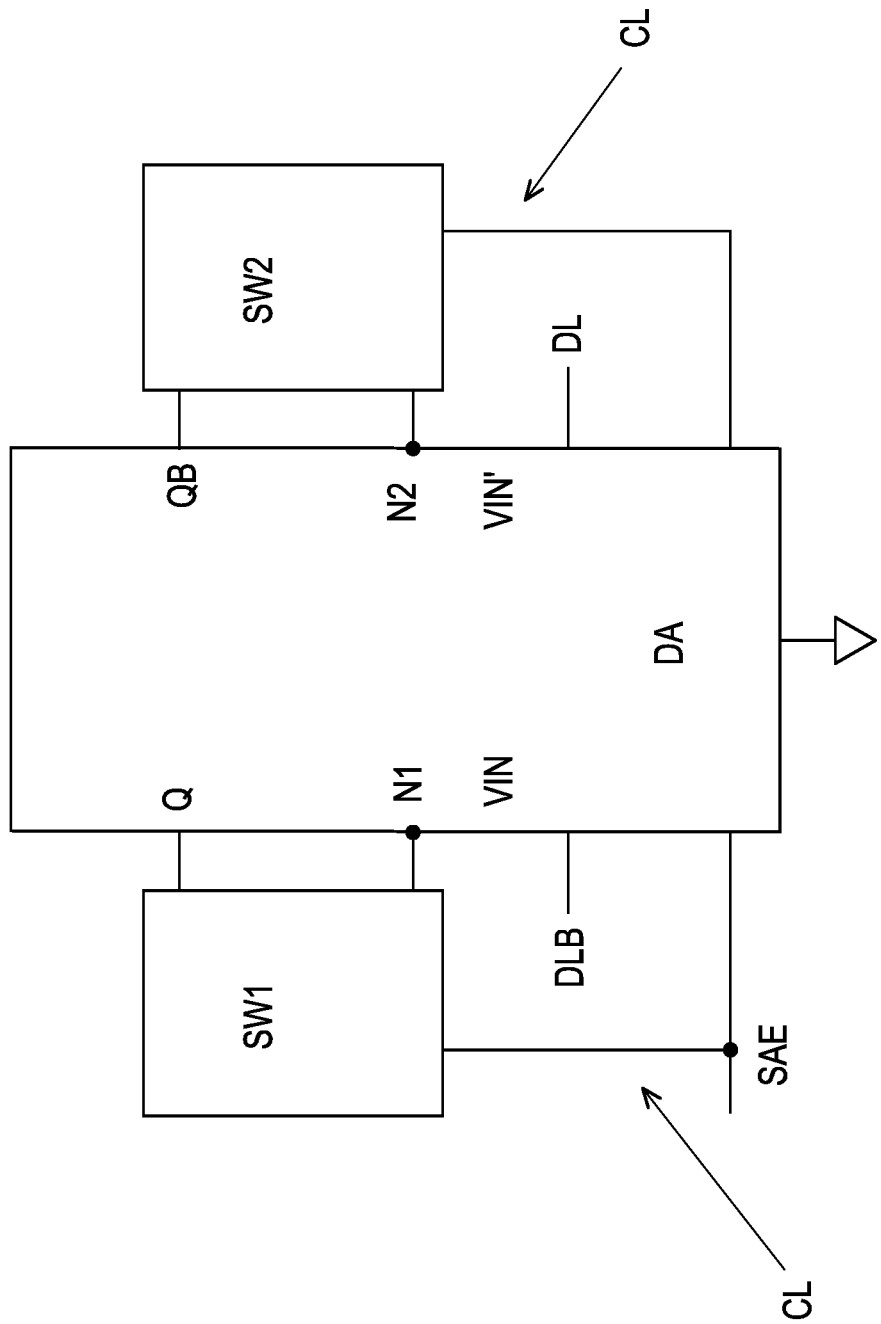
FIG. 2A is a schematic diagram of a sense amplifier circuit as shown in FIG. 1A in accordance with some embodiments.
Figure 2B:
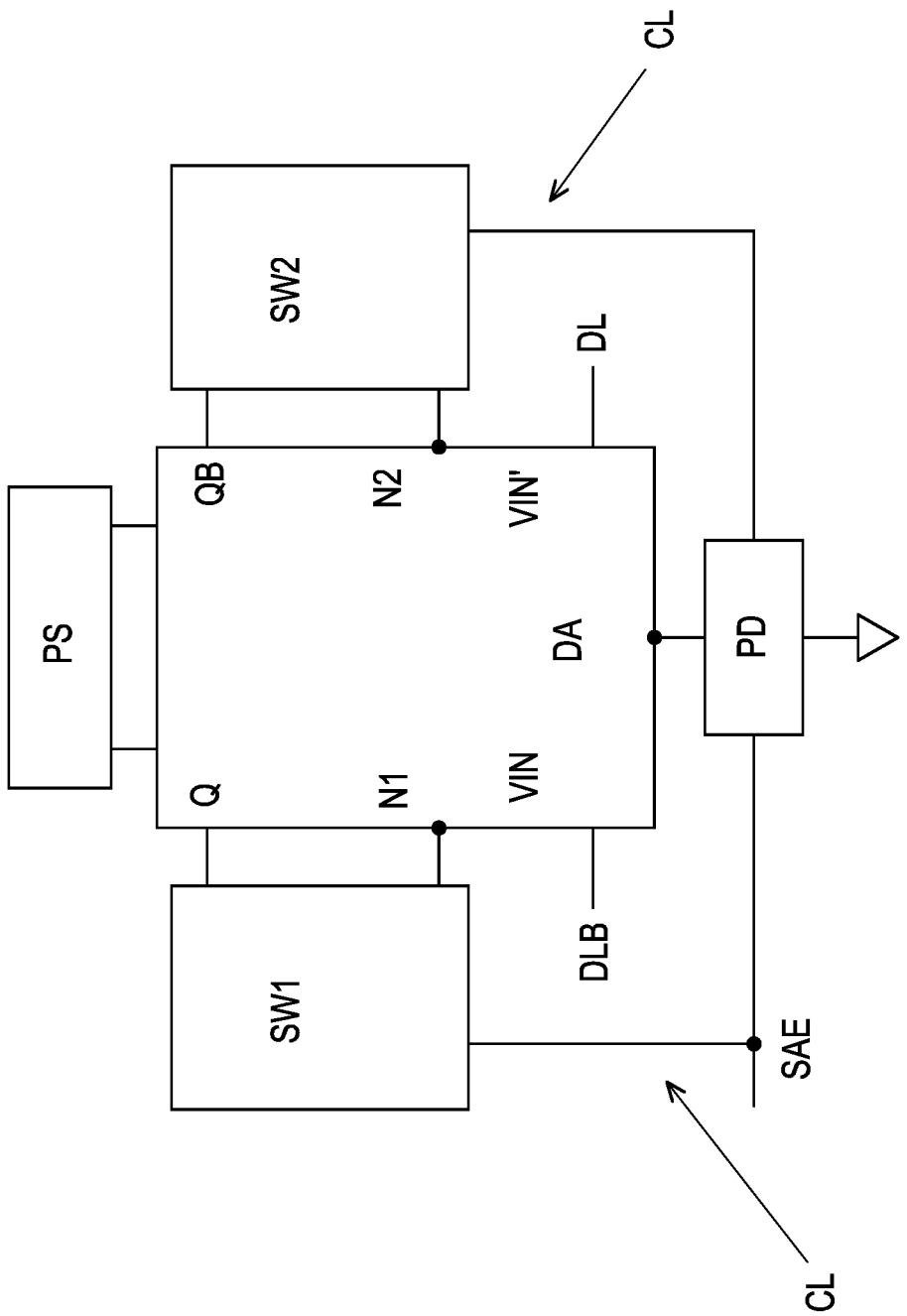
FIG. 2B is a schematic diagram of a sense amplifier circuit as shown in FIG. 1A in accordance with another embodiments.
Figure 2C:
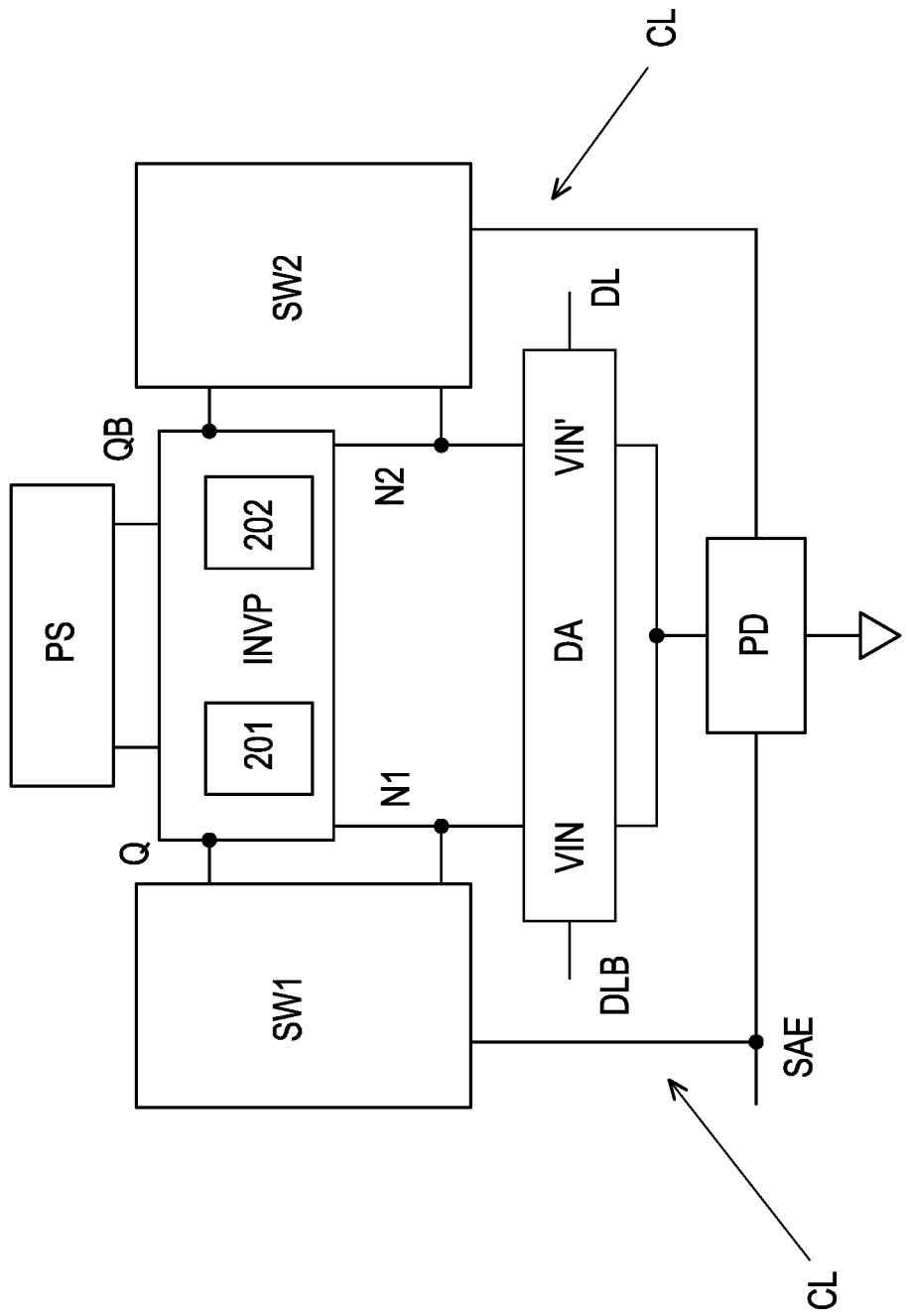
FIG. 2C is a schematic diagram of a sense amplifier circuit as shown in FIG. 1A in accordance with some embodiments.
Figure 2D:
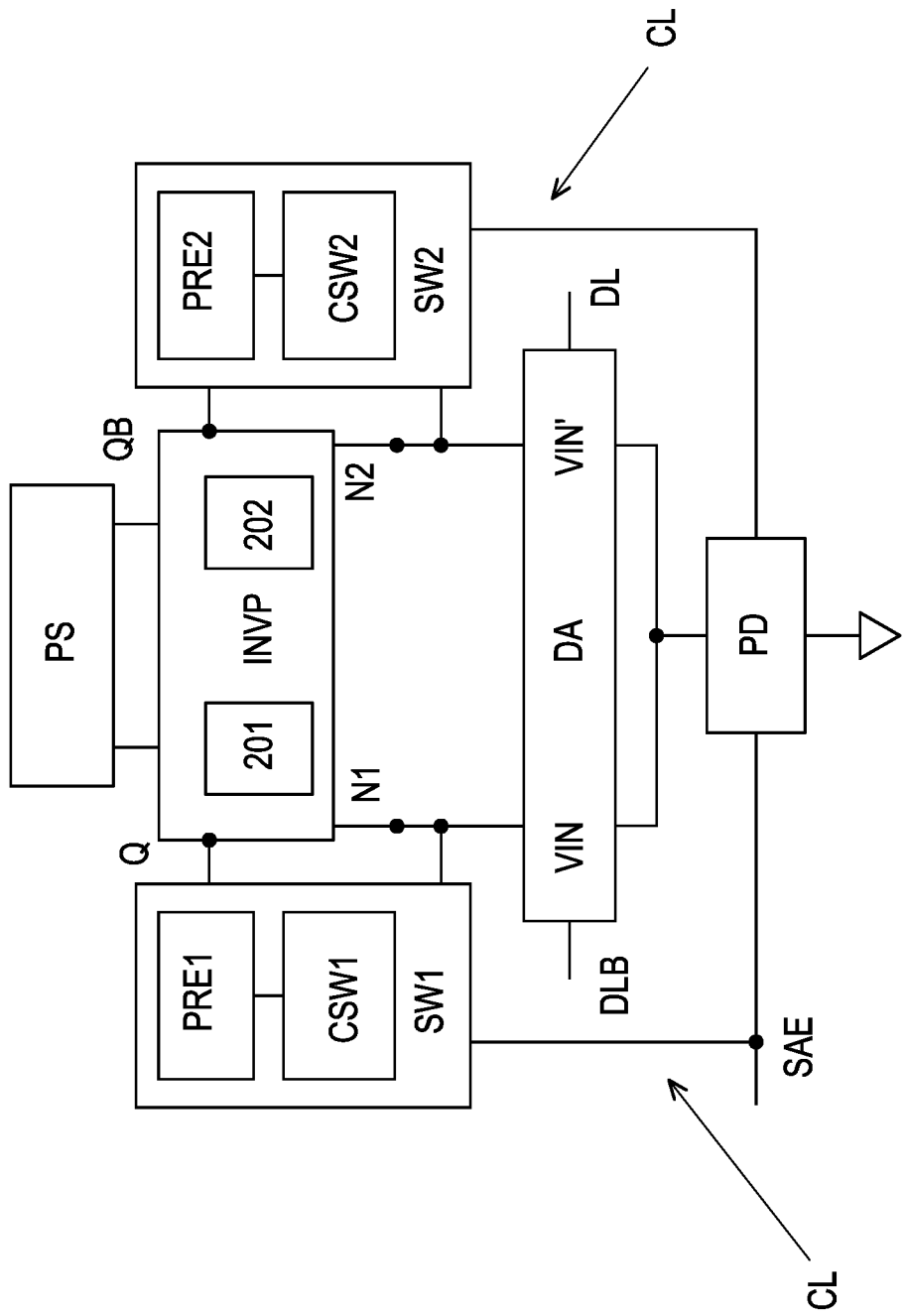
FIG. 2D is a schematic diagram of a sense amplifier circuit as shown in FIG. 1A in accordance with another embodiments.

FIG. 2A is a schematic diagram of a sense amplifier circuit as shown in FIG. 1A in accordance with some embodiments. FIG. 2B is a schematic diagram of a sense amplifier circuit as shown in FIG. 1A in accordance with another embodiments. FIG. 2C is a schematic diagram of a sense amplifier circuit as shown in FIG. 1A in accordance with some embodiments. FIG. 2D is a schematic diagram of a sense amplifier circuit as shown in FIG. 1A in accordance with some embodiments. The sense amplifier circuit illustrated in FIG. 2B, FIG. 2C, and FIG. 2D is similar to the sense amplifier circuit illustrated in FIG. 2A. Therefore, the same reference numerals are used to refer to the same or liked parts, and its detailed description will be omitted herein.

Referring to FIG. 2A, FIG. 2B, FIG. 2C, and FIG. 2D, the sense amplifier circuit 200 is provided. The sense amplifier circuit 200 includes, a differential amplifier DA, a first switch SW1, and a second switch SW2. The differential amplifier DA includes a first input node N1 and a second input node N2. The differential amplifier DA is coupled to the first switch SW1, and the second switch SW2. The first switch SW1 is coupled to a control line CL. The first node of the first switch SW1 is coupled to the first input node N1, and a second node of the first switch SW1 is coupled to the first output node Q. The second switch SW2 is coupled to the control line CL. The first node of the second switch SW2 is coupled to the second input node N2, and the second node of the second switch SW2 is coupled to the second output node QB.

In some embodiments, the sense amplifier circuit 200 includes a power supply PS, a differential amplifier DA, a pull-down circuit PD, a first switch SW1, and a second switch SW2. The differential amplifier DA is coupled to the power supply PS, the first switch SW1, and the second switch SW2. The pull-down circuit PD is coupled to the differential amplifier DA. In some embodiments, the pull-down circuit PD may be coupled to the first switch SW1 and the second switch SW2 as well. The first switch SW1 is coupled to the first data line DL, a control line CL, and the differential amplifier DA. The second switch SW2 is coupled to the second data line DLB, the control line CL, and the differential amplifier DA.

In some embodiments, the differential amplifier DA amplifies a voltage difference of the first output node Q and the second output node QB according to a first input voltage VIN of the first input node N1 and a second input voltage VIN' of the second input node N2. The first switch SW1 pre-charges the first input node N1 by a first output voltage of the first output node Q while the control line CL is received a select signal SAE where the sense amplifier circuit is enabled by the select signal SAE. The second switch SW2 the second input node N2 by a second output voltage of the second output node QB while the control line CL is received the select signal SAE where the sense amplifier circuit is enabled by the select signal SAE. In some embodiments, the voltage difference between the first input node N1 and the second input node N2 may decrease gradually during a sensing period.

In accordance with some embodiments, the power supply PS provides the power voltage. The differential amplifier DA provides the input voltages VIN, VIN'. In accordance with some embodiments of the disclosure, the input voltages VIN, VIN' are provided by virtue of the column decoder 101 through the first data line DL and the second data line DLB. The pull-down circuit PD provides a biasing current source. In accordance with some embodiments of the disclosure, the pull-down circuit PD provides a biasing voltage source. The first switch SW1 transfers a first bit line voltage to a first input node N1 upon receiving a select signal SAE from a controller (not shown). The second switch SW2 transfers a second bit line voltage to a second input node N2 upon receiving the select signal SAE from the controller. In some embodiments, the voltage level of the first input voltage VIN of the first input node N1 and the voltage level of the second input voltage VIN' of the second input node N2 are complement. In some embodiments, the voltage level of the second bit line voltage is complementary to the first bit line voltage.

Referring to FIG. 2A, FIG. 2B, FIG. 2C, and FIG. 2D, in accordance with some embodiments of the disclosure, the sense amplifier circuit 200 includes an inverter pair INVP and a pull-down circuit PD. The inverter pair INVP is coupled to the power supply PS, the first switch SW1, the second switch SW2, and the differential amplifier DA. The pull-down circuit PD is coupled to the differential amplifier, the first switch SW1 and the second switch SW1. In some embodiments, the pull-down circuit PD provides a biasing current source to discharge the sense amplifier circuit.

In accordance with some embodiments of the disclosure, the inverter pair INVP is adapted to provide positive feedback for voltage latching behavior. In the exemplary embodiment, the inverter pair INVP is a kind of latch circuit, for example, a cross-coupled inverter. As such, the inverter pair INVP is adapted to retain the stored data of the memory cells MC in the memory arrays MA from the input of the sense amplifier circuit 200 without being periodically refreshed. In some embodiments, the inverter pair INVP includes two inverters. A first inverter 201 may include a pull-up transistor and a pull-down transistor (not shown). The pull-up transistor may be a P-type Metal-Oxide-Semiconductor (PMOS) field effect transistor, while the pull-down transistor may be an N-type Metal-Oxide-Semiconductor (NMOS) field effect transistor. The pull-up transistor and the pull-down transistor of the first inverter 201 share a common source/drain terminal, and such common source/drain terminal may be referred as a first storage node Q of the memory cells MC. In addition, the other source/drain terminal of the pull-up transistor is coupled to a working voltage VDD (not shown) provided from the power supply PS. On the other hand, the other source/drain terminal of the pull-down transistor is coupled to a reference voltage VSS (not shown), such as a ground voltage. In some embodiments, the reference voltage is pre-charged to the first storage node Q. For example, the reference voltage may be the first bit line voltage. Furthermore, gate terminals of the pull-up transistor and the pull-down transistor of the first inverter 201 are connected with each other. A node coupled to the gate terminals of the pull-up transistor and the pull-down transistor may be an input terminal of the first inverter 201, and the first storage node Q may be an output terminal of the first inverter 201.

Similarly, a second inverter 202 in the inverter pair INVP may include a pull-up transistor and a pull-down transistor. The pull-up transistor may be a PMOS field effect transistor, while the pull-down transistor may be an NMOS field effect transistor. The pull-up transistor and the pull-down transistor of the second inverter 202 share a common source/drain terminal, which may be referred as a second storage node QB of the memory cells MC. The other source/drain terminal of the pull-up transistor is coupled to the working voltage VDD (not shown), while the other source/drain terminal of the pull-down transistor is coupled to the reference voltage VSS (not shown). In addition, gate terminals of the pull-up transistor and the pull-down transistor of the second inverter 202 are connected with each other. A node coupled to the gate terminals of the pull-up transistor and the pull-down transistor of the second inverter 202 may be an input terminal of the second inverter, while the second storage node QB may be an output terminal of the second inverter 202. On the other hand, the other source/drain terminal of the pull-down transistor is coupled to a reference voltage VSS (not shown), such as a ground voltage. In some embodiments, the reference voltage is pre-charged to the second storage node QB. For example, the reference voltage may be the second bit line voltage. Referring to FIG. 2A, FIG. 2B, FIG. 2C, and FIG. 2D, in accordance with some embodiments of the disclosure, the first switch SW1 further includes a first pre-charge switch PRE1 and a first control switch CSW1. The second switch SW2 further includes a second pre-charge switch PRE2 and a second control switch CSW2. The first pre-charge switch PRE1 may be directly coupled to the first inverter 201 and the differential amplifier DA. The second pre-charge switch PRE2 may be directly coupled to the second inverter 202 and the differential amplifier DA. The first control switch CSW1 is coupled to the first pre-charge switch PRE1 and the first data line DL. The second control switch CSW2 is coupled to the second pre-charge switch PRE2 and the second data line DLB. The first control switch CSW1 is coupled to the pull-down circuit PD through the control line CL. The second control switch CSW2 is coupled to the pull-down circuit PD through the control line CL. In some embodiments, the first control switch CSW1 and the second control switch CSW2 may be coupled to the pull-down circuit PD through the same control line CL.

In accordance with some embodiments of the disclosure, the first pre-charge switch PRE1 may bring the first data line DL and the second data line DLB to be either the same (for example, VDD and VDD) or the complement voltage (for example, VDD and VSS) before a read cycle. The first pre-charge switch PRE1 may consist of a transistor that can be either NMOS or PMOS devices. In some embodiments, the first pre-charge switch PRE1 and the first control switch CSW1 may be PMOS devices. The first control switch CSW1 are used to connect the first data line DL to, for instance, the logic high (i.e., 1 or VCC). The second pre-charge switch PRE2 may consist of a transistor that can be either NMOS or PMOS devices. In some embodiments, the second pre-charge switch PRE2 and the second control switch CSW2 may be PMOS devices. The second control switch CSW2 is used to connect the second data line DLB to, for instance, the logic high (i.e., 1 or VCC). The first pre-charge switch PRE1 is connected between the first control switch CSW1 and the first inverter 201, and the second pre-charge switch PRE2 is connected between the second control switch CSW2 and the second inverter 202 to ensure that the first storage node Q and the second storage node QB end up being the same voltage.

In yet other embodiments, the first pre-charge switch PRE1 and the second pre-charge switch PRE2 ensure that the first storage node (i.e., the first output node) Q and the second storage node (i.e., the second output node) QB end up being the complement voltage. As such, the voltage difference (voltage offset) between the first input node N1 and the second input node N2 is pre-established and then the sense amplifier SA is able to sense the pre-established voltage difference much earlier (i.e., the predetermined bit-line developing time will be decreased) before the sensing period. Therefore, the sensing speed is able to be enhanced after the pull-down circuit PD is enabled during the sensing period. In some embodiments, the bit-line developing time indicates the period of time that the voltage difference (or voltage offset, voltage swing) changes from 0 to relatively larger enough than the voltage offset between the bit-lines BL, BLB so as to be identified by the sense amplifier SA.

To pre-charge the first storage node Q, the select signal SAE is brought to a logic low (i.e., 0 or VSS). That is, the first control switch CSW1 is enabled when the sense amplifier SA is enabled at logic low. This enables the first control switch CSW1 and the first pre-charge switch PRE1 which then charge and equalize the first storage node Q and the second storage node QB to be VCC before a read cycle. Similarly, to pre-charge the second storage node QB, the select signal SAE is brought to a logic low (i.e., 0 or VSS). That is, the second control switch CSW2 is enabled when the sense amplifier SA is enabled at logic low. This enables the second control switch CSW2 and the second pre-charge switch PRE2 which then charge and equalize the second storage node QB and the first storage node Q to be VCC before a read cycle.

In some embodiments, the first storage node Q as the input terminal of the second inverter 202 is coupled to the second storage node QB as the output terminal of the first inverter 201, and the second storage node QB as the input terminal of the first inverter 201 is coupled to the first storage node Q as the output terminal of the second inverter 202. In other words, the first inverter 201 and the second inverter 202 are cross-coupled. As a result, the first storage node Q and the second storage node QB are ensured to store complementary logic data. For instance, when a logic data "0" is stored at the first storage node Q, the P-type pull-up transistor of the second inverter 202 may be enabled as its gate terminal is coupled to the first storage node Q of the first inverter 201, and the second storage node QB of the second inverter 202 as a source/drain terminal of the pull-up transistor is pulled up by the working voltage VDD coupled to the other source/drain terminal of the pull-up transistor. Therefore, a logic data "1" complementary to the logic data "0" is stored at the second storage node QB.

On the other hand, the N-type pull-down transistor of the second inverter 202 is kept in an off state as its gate terminal is also coupled to the first storage node Q holding at the logic data "0", thus the second storage node QB as a source/drain terminal of the pull-down transistor of the second inverter 202 would not be pulled down by the reference voltage (e.g., VSS) coupled to the other source/drain terminal of the pull-down transistor of the second inverter 202. In addition, the N-type pull-down transistor of the first inverter 201 is enabled as its gate terminal is coupled to the second storage node QB holding at the logic data "1", and the first storage node Q as a source/drain terminal of the pull-down transistor of the first inverter 201 is kept discharged by the reference voltage (e.g., VSS) coupled to the other source/drain terminal of the pull-down transistor of the first inverter 201. In addition, the P-type pull-up transistor of the first inverter 201 is kept in an off state as its gate terminal is also coupled to the second storage node QB holding at the logic data "1", thus the first storage node Q as a source/drain terminal of the pull-up transistor of the first inverter 201 would not be pulled up by the working voltage VDD coupled to the other source/drain terminal of the pull-up transistor of the first inverter 201. Therefore, the logic data "0" can be retained at the first storage node Q.

Figure 2E:
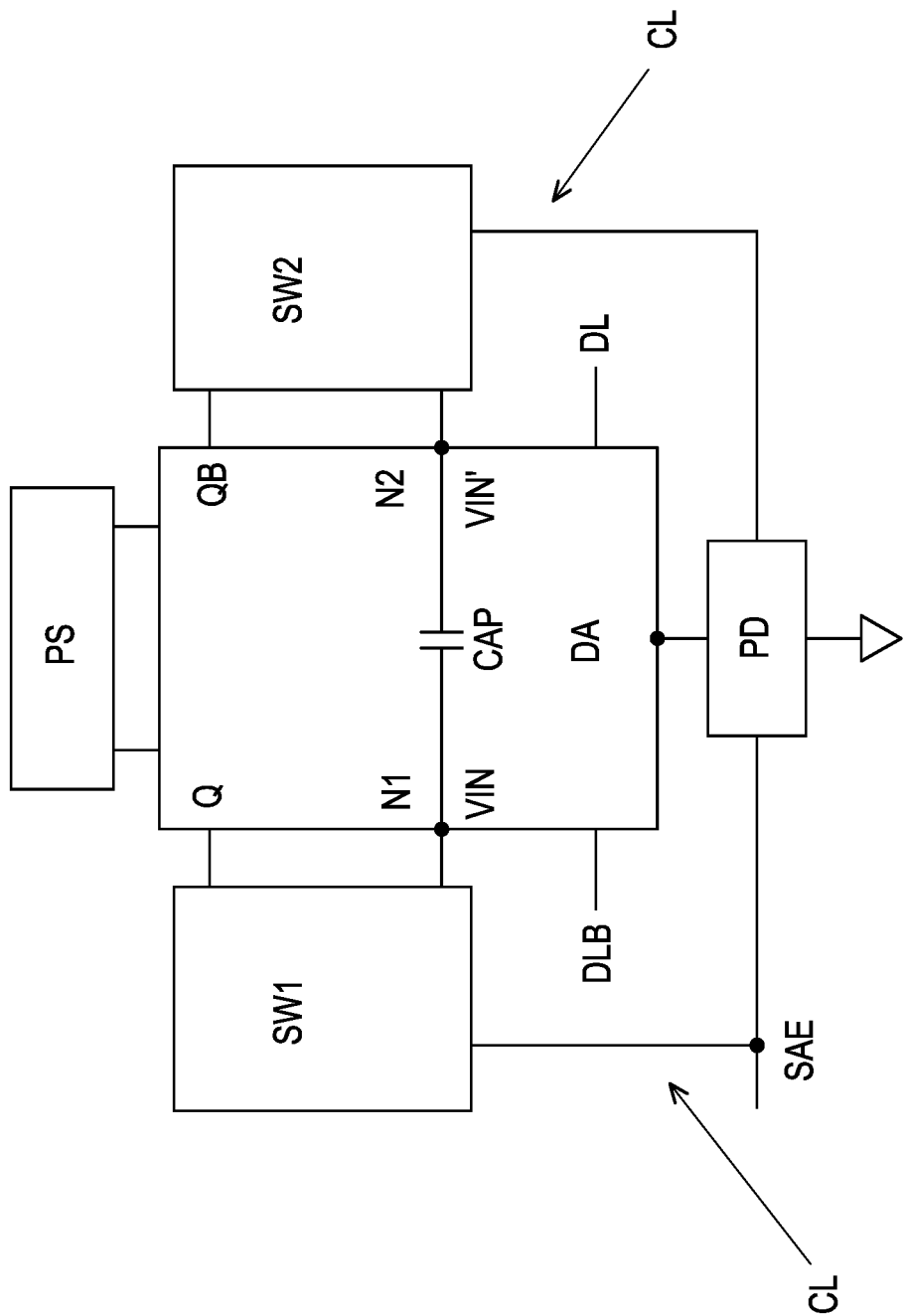
FIG. 2E is a schematic diagram of a sense amplifier circuit as shown in FIG. 1A in accordance with another embodiments.
Figure 2F:
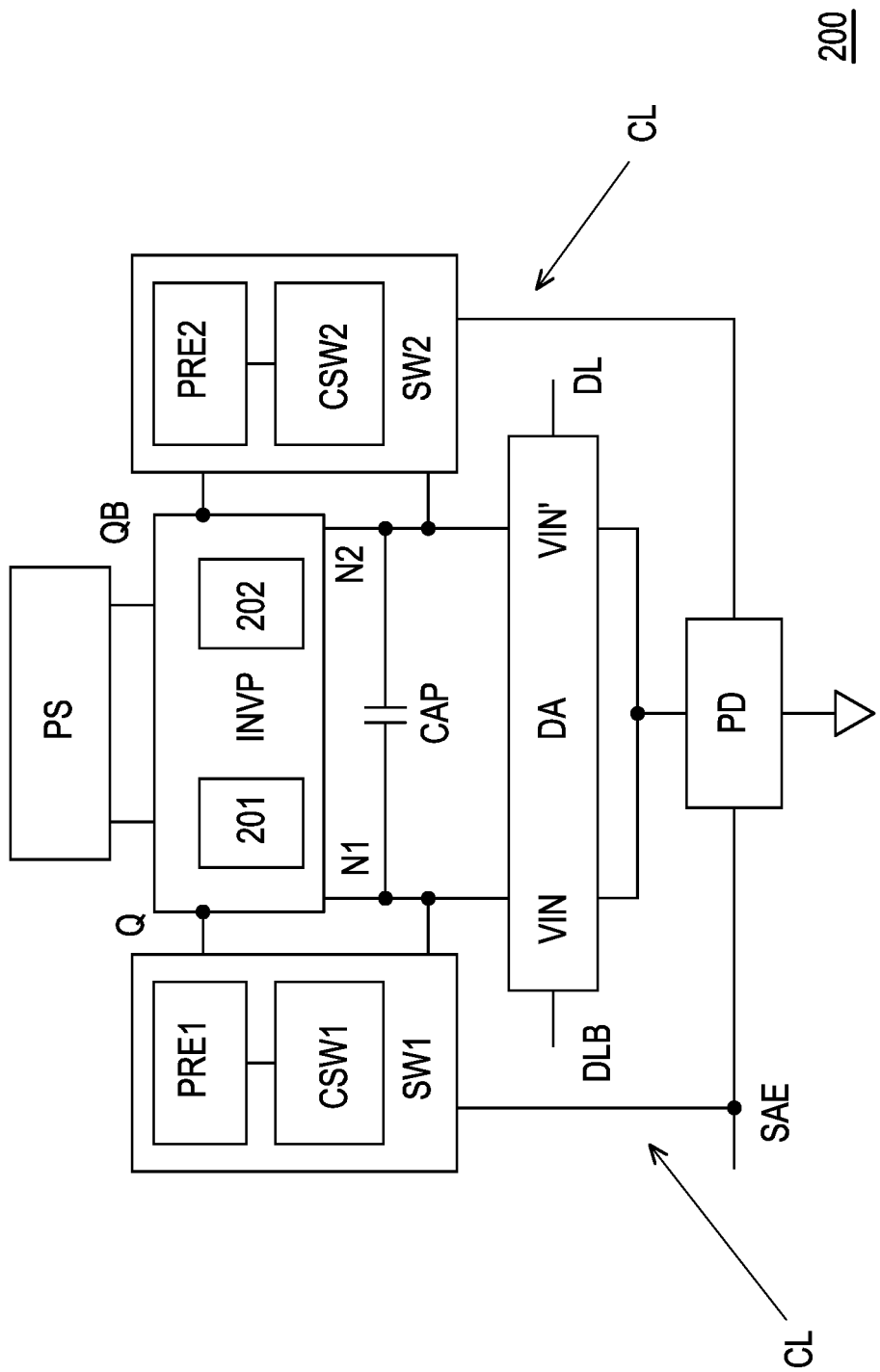
FIG. 2F is a schematic diagram of a sense amplifier circuit as shown in FIG. 1A in accordance with another embodiments.

FIG. 2E is a schematic diagram of a sense amplifier circuit as shown in FIG. 1A in accordance with another embodiments. FIG. 2F is a schematic diagram of a sense amplifier circuit as shown in FIG. 1A in accordance with yet another embodiment. The sense amplifier circuit illustrated in FIG. 2E and FIG. 2F is similar to the sense amplifier circuit illustrated in FIG. 2A-2D. Therefore, the same reference numerals are used to refer to the same or liked parts, and its detailed description will be omitted herein.

Referring to FIG. 2A and FIG. 2E, the differential amplifier DA may further include a matching capacitor CAP. The matching capacitor CAP is coupled to the first switch SW1 and the second switch SW2 at the first input node N1 and the second input node N2.

In some embodiments, the matching capacitor CAP is adapted to keep a voltage difference between the first input voltage VIN of the first input node N1 and the second input voltage VIN' of the second input node N2 during a sensing period. In some embodiments, the voltage difference between the first input node N1 and the second input node N2 may be equal to the voltage difference between the first bit line voltage and the second bit line voltage transferred from the first bit line BL (or the first data line DL) and the second bit line BLB (or the second data line DL) before the sensing period.

Figure 3A:
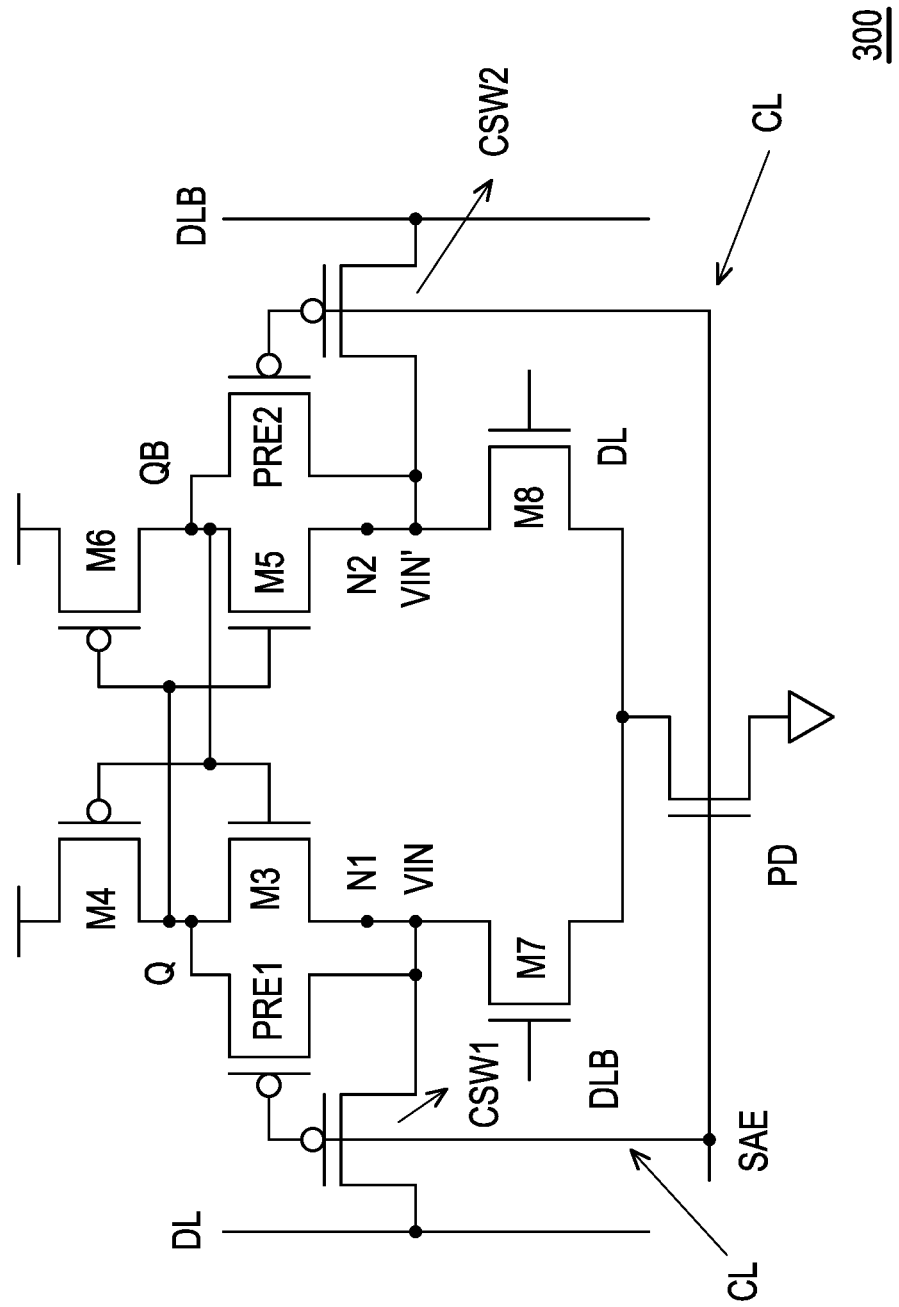
FIG. 3A is a schematic diagram of a sense amplifier circuit as shown in FIG. 1A in accordance with some embodiments.
Figure 3B:
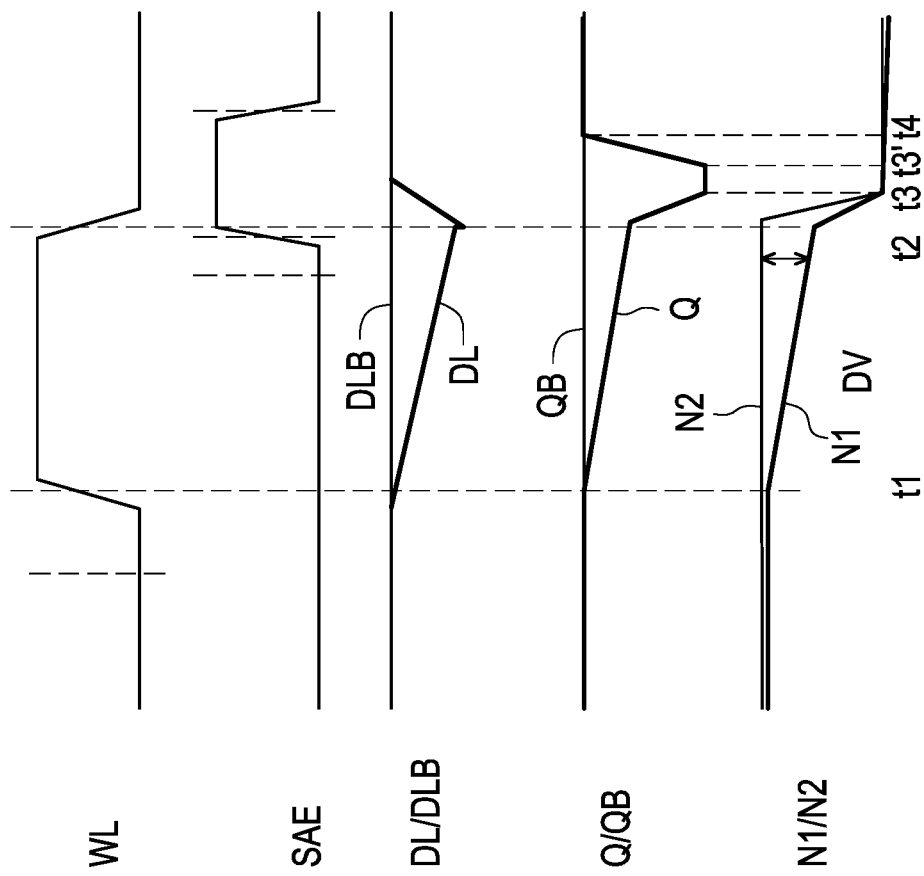
FIG. 3B is a timing diagram of the sense amplifier circuit shown in FIG. 3A in the operation process according to some embodiments of the present disclosure.

FIG. 3A is a schematic diagram of a sense amplifier circuit as shown in FIG. 1A in accordance with some embodiments. FIG. 3B is a timing diagram of the sense amplifier circuit shown in FIG. 3A in the operation process according to some embodiments of the present disclosure.

Referring to FIG. 3A, the sense amplifier circuit includes the differential amplifier, the first switch, the second switch, the first control switch CSW1, and the second control switch CSW2. The differential amplifier includes an inverter pair, a pull-down switch PD, a first input switch M7 and a second input switch M8. The inverter pair includes a third switch M3, a fourth switch M4, a fifth switch M5, and a sixth switch M6. The third switch M3 are coupled to the first pre-charge switch PRE1, the first control switch, and a first input switch M7. The fifth switch M5 are coupled to the first pre-charge switch PRE1, the second pre-charge switch PRE2, a second control switch CSW2, and a second input switch M8. In some embodiments, the fourth switch M4 is coupled to the power supply, the third switch M3, and the first pre-charge switch PRE1. In some embodiments, the sixth switch M6 is coupled to the power supply, the fifth switch M5, and the second pre-charge switch PRE2. In some embodiments, the first pre-charge switch PRE1 is coupled to the first data line DL and the first input switch M7. In some embodiments, the second pre-charge switch PRE2 is coupled to the second data line DLB and the second input switch M8. In some embodiments, the drain node (i.e., the first output node) Q of the fourth switch M4 (or the drain node Q of the third switch M3) is connected to the gate node of the fifth switch M5 and the gate node of the sixth switch M6. Similarly, the drain node (i.e., the second output node) QB of the sixth switch M6 (or the drain node Q of the fifth switch M5) is connected to the gate node of the third switch M3 and the gate node of the fourth switch M4. In some embodiments, a gate node of the first pre-charge PRE1 is coupled to a gate node of the first control switch CSW1. A gate node of the second pre-charge PRE2 is coupled to a gate node of the second control switch CSW2. In some embodiments, the source node of the third switch M3 is coupled to the first input node N1 and the source node of the fifth switch M5 is coupled to the second input node N2.

In some embodiments, the controller determines whether the first bit line voltage is transmitted through the control line SAE to the first input node N1 by a voltage level of the select signal SAE. In some embodiments, the controller determines whether the second bit line voltage is transmitted through the control line SAE to the second input node N2 by the voltage level of the select signal SAE.

In some embodiments, the voltage level of the first input voltage VIN of the first input node N1 is complementary to an output voltage of the first output node Q of the third switch M3 (and/or the first pre-charge switch PRE1). The voltage level of the second input voltage VIN of the second input node N1 is the same as an output voltage of the second output node QB of the fifth switch M5 (and/or the second pre-charge switch PRE2). In alternative embodiments, the voltage level of the first input voltage VIN of the first input node N1 is the same as an output voltage of the first output node Q of the third switch M3 (and/or the first pre-charge switch PRE1). The voltage level of the second input voltage VIN of the second input node N1 is complementary to an output voltage of the second output node QB of the fifth switch M5 (and/or the second pre-charge switch PRE2).

In some embodiments, the first input switch M7 and the second input switch M8 respectively receive the first bit line voltage and the second bit line voltage from the plurality of bit lines selected by the column decoder.

In some embodiments, the voltage difference between the first input switch M7 and the second input switch M8 is detected by the sense amplifier 200 when the voltage difference reaches a predetermined voltage difference.

In some embodiments, the first control switch CSW1 receives the select signal SAE through the gate node of the first control switch CSW1 from the controller and receives the first bit line voltage through a drain node of the first control switch CSW1. In some embodiments, the second control switch CSW2 receives the select signal SAE through the gate node of the second control switch CSW2 from the controller and receives the second bit line voltage through a drain node of the second control switch CSW2. In some embodiments, the pull-down switch PD receives the select signal SAE through the gate node of the pull-down switch PD from the controller.

In some embodiments, the first pre-charge switch PRE1 transfers the first bit line voltage to a drain node (or the first output node Q) of the third switch M3. The second pre-charge switch PRE1 transfers the second bit line voltage to a drain node (or the second output node QB) of the fifth switch M5.

In accordance with some embodiments of the disclosure, a voltage level of the source node of the third switch M3 (or the first input node N1) and a voltage level of the source node of the fifth switch M5 (or the second input node N2) are respectively pre-charged to a first voltage level (for example, logic "0") and a second voltage level (for example, logic "1"). The first voltage level is complementary to the second voltage level. In some embodiments, the voltage level of the source node of the third switch M3 and a voltage level of the source node of the fifth switch M5 are respectively pre-charged to the first voltage level (for example, logic "1") and the second voltage level (for example, logic "0").

Referring to FIG. 3A and FIG. 3B, the time frame between the time t1 and the time t3 is the bit-line developing period. The time frame between the time t2 and the time t3 is the is the offset detecting period. The time frame between the time t3 and the time t4 is the is the sensing period, and the sense amplifier circuit is enabled by the select signal SAE at this period.

The word line address is selected during the period from the time t1 to the time t3. The voltage level of the first data line DL and the voltage level of the second data line DLB is charged at the same logic level (e.g., logic "1") before the time t1. The voltage level of the first output node Q and the voltage level of the second output node QB is charged at the same logic level (e.g., logic "1") before the time t1. The voltage level of the first input node N1 is the same as the voltage level of second input node N2 (e.g., logic "1") before the time t1.

The voltage level of the first input node N1 is pre-charged by a first output voltage of the first output node Q according to the first input voltage VIN of the first input node N1 while the control line CL is received the select signal SAE during the early stage of the bit-line developing period. The voltage level of the second input node N2 is pre-charged by a first output voltage of the second output node QB according to the second input voltage VIN' of the second input node N2 while the control line CL is received the select signal SAE during the early stage of the bit-line developing period. The voltage level of the first output node Q is the same as the first input voltage VIN of a first input node N1. The voltage level of the second output node QB is the same as the second input voltage VIN of the second input node N2.

The voltage difference (or offset) DV between the first input voltage VIN of the first input node N1 and the second input voltage VIN' of the second input node N2 is large enough at a predetermined value to be sensed after the time t2.

After the time t1, the voltage level of the first data line, the voltage level of the first output node Q, and the voltage level of the first input node N1 decline gradually following along a first slope.

After the time t3, the voltage level of the first data line rises gradually following along a second slope, however, the voltage level of the first output node Q and the voltage level of the first input node N1 declines following along a third slope due to the pull-down circuit PD is enabled. The third slope is larger (or steep) than the first slope.

From the time t3 to the time t3', the voltage level of the first output node Q, the second output node QB, and the voltage level of the first input node N1 remain unchanged. However, the voltage level of the second input node N2 declines (or decreases) gradually following along a fourth slope. The forth slope is substantially equal to the third slope. In contrast, the voltage level of the second output node QB and the voltage level of the second input node N2 remain unchanged from the time t1 to the time t3.

The voltage difference (or offset) DV between the first input voltage VIN of the first input node N1 and the second input voltage VIN' of the second input node N2 is large enough at a predetermined value to be sensed after the time t2.

The voltage difference DV between the first input node N1 and the second input node N2 which shows the latching behavior is kept at the fixed value in the early stage of the offset detecting period from the time t2 to the time t3 and then gradually decreases in the later stage of the offset detecting period. It is noted that the waveform of the voltage difference DV will not crossover from the time t1 to the time t3 due to the device mismatch. That is, the sense amplifier circuit will not suffer from the influence of the device mismatch and is able to enhance the sensing speed of the sense amplifier circuit 300.

Figure 4A:
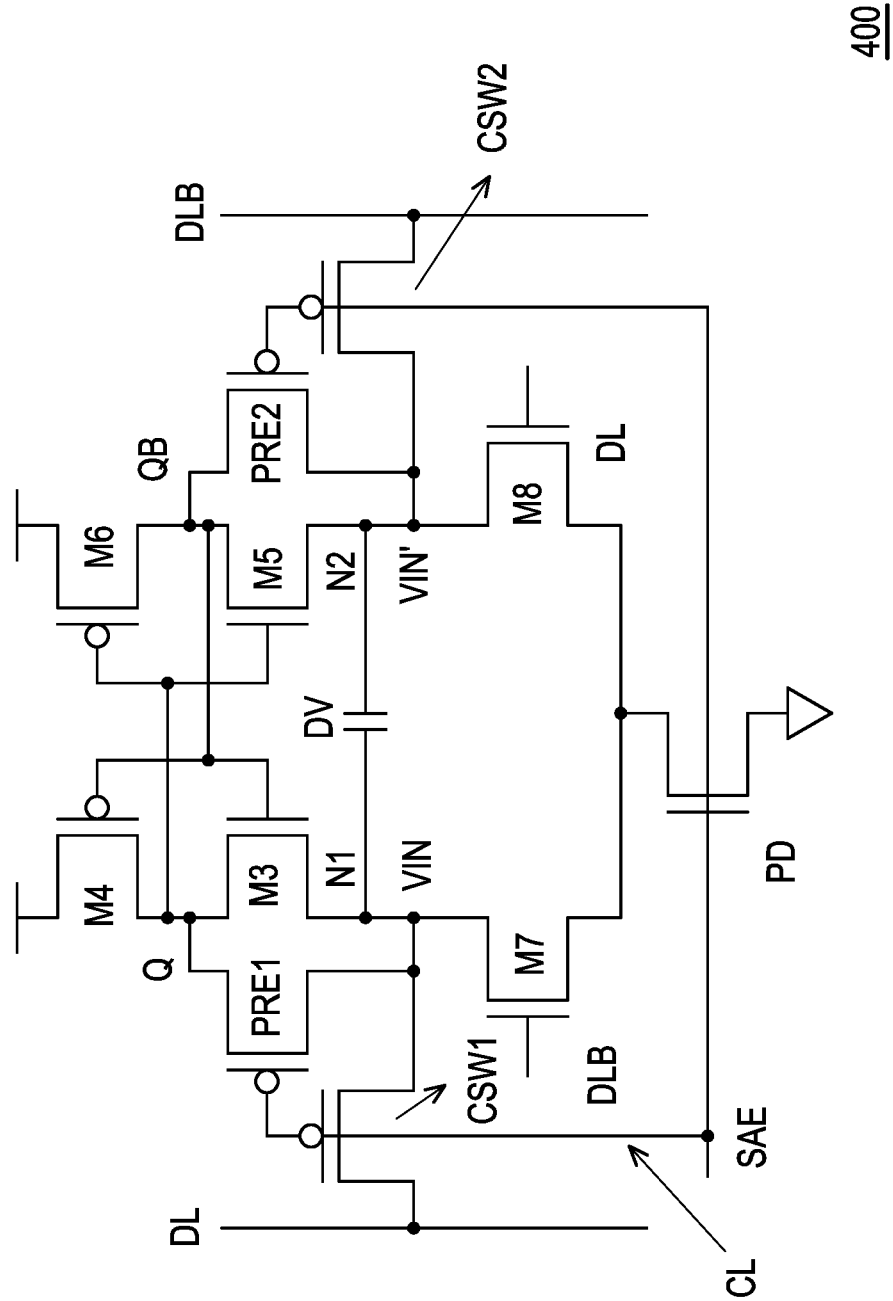
FIG. 4A is another schematic diagram of a sense amplifier circuit as shown in FIG. 1A in accordance with some embodiments.

FIG. 4A is another schematic diagram of a sense amplifier circuit as shown in FIG. 1A in accordance with some embodiments. FIG. 4B is a timing diagram of the sense amplifier circuit shown in FIG. 4A in the operation process according to some embodiments of the present disclosure.

Referring to FIG. 4A and FIG. 4B, the memory circuit with the sense amplifier circuit includes the differential amplifier, the first switch, the second switch, the matching capacitor CAP, the first control switch CSW1, and the second control switch CSW2. The differential amplifier includes an inverter pair, a pull-down switch PD, a first input switch M7 and a second input switch M8. The inverter pair includes a third switch M3, a fourth switch M4, a fifth switch M5, and a sixth switch M6. The third switch M3 are coupled to the first pre-charge switch PRE1, the first control switch, and a first input switch M7. The fifth switch M5 are coupled to the first pre-charge switch PRE1, the second pre-charge switch PRE2, a second control switch CSW2, and a second input switch M8. In some embodiments, the fourth switch M4 is coupled to the power supply, the third switch M3, and the first pre-charge switch PRE1. In some embodiments, the sixth switch M6 is coupled to the power supply, the fifth switch M5, and the second pre-charge switch PRE2. In some embodiments, the first pre-charge switch PRE1 is coupled to the first data line DL and the first input switch M7. In some embodiments, the second pre-charge switch PRE2 is coupled to the second data line DLB and the second input switch M8. In some embodiments, the drain node (i.e., the first output node) Q of the fourth switch M4 (or the drain node Q of the third switch M3) is connected to the gate node of the fifth switch M5 and the gate node of the sixth switch M6. Similarly, the drain node (i.e., the second output node) QB of the sixth switch M6 (or the drain node Q of the fifth switch M5) is connected to the gate node of the third switch M3 and the gate node of the fourth switch M4. In some embodiments, a gate node of the first pre-charge PRE1 is coupled to a gate node of the first control switch CSW1. A gate node of the second pre-charge PRE2 is coupled to a gate node of the second control switch CSW2. In some embodiments, the source node of the third switch M3 is coupled to the first input node N1 and the source node of the fifth switch M5 is coupled to the second input node N2.

In some embodiments, the matching capacitor CAP is coupled to the drain node of the first input switch M7, the drain node of the first pre-charge switch PRE1, the drain node of the second pre-charge switch PRE2, the second input switch M8, the first input node N1, the second input node N2, the source node of the third switch M3, and the source node of the fifth switch M5. By analogy, the function of the components may also be represented in a manner similar to FIG. 3A.

In some embodiments, the matching capacitor CAP is used to keep a voltage difference DV between the first input voltage VIN of the first input node N1 and the second input voltage VIN' of the second input node N2 at a fixed value during a sensing period.

In some embodiments, the first switch includes a first pre-charge switch PRE1 and a first control switch CSW1. The first control switch CSW1 is enabled when the select signal SAE is enabled and a gate node voltage of the first pre-charge switch PRE1 is at logic low. In some embodiments, the second switch includes a second pre-charge switch PRE2 and a second control switch CSW2. The second control switch CSW2 is enabled when the select signal SAE is enabled and a gate node voltage of the second pre-charge switch PRE2 is at logic low.

In some embodiments, the voltage difference DV between the first input voltage VIN of the first input node N1 and the second input voltage VIN' of the second input node N2 will be kept at a fixed value by the matching capacitor CAP during the positive feedback amplify period (i.e., from the time t1 to the time t3), and becomes smaller than the fixed value after the sensing period (i.e., after the time t3).

Referring to FIG. 2A, FIG. 4A and FIG. 4B, the time frame between the time t1 and the time t3 is the bit-line developing period. The time frame between the time t2 and the time t3 is the offset detecting period. The time frame between the time t3 and the time t4 is the sensing period, and the sense amplifier circuit is enabled by the select signal SAE at this period.

The word line address is selected during the period from the time t1 to the time t3. The voltage level of the first data line DL and the voltage level of the second data line DLB is charged at the same logic level (e.g., logic "1") before the time t1. The voltage level of the first output node Q and the voltage level of the second output node QB is charged at the same logic level (e.g., logic "1") before the time t1. The voltage level of the first input node N1 is the same as the voltage level of second input node N2 (e.g., logic "1") before the time t1.

The voltage level of the first input node N1 is pre-charged by a first output voltage of the first output node Q according to the first input voltage VIN of the first input node N1 while the control line CL is received the select signal SAE during the early stage of the bit-line developing period. The voltage level of the second input node N2 is pre-charged by a first output voltage of the second output node QB according to the second input voltage VIN' of the second input node N2 while the control line CL is received the select signal SAE during the early stage of the bit-line developing period. The voltage level of the first output node Q is the same as the first input voltage VIN of a first input node N1. The voltage level of the second output node QB is the same as the second input voltage VIN of the second input node N2.

After the time t1, the voltage level of the first data line, the voltage level of the first output node Q, and the voltage level of the first input node N1 decline gradually following along a first slope.

After the time t3, the voltage level of the first data line rises gradually following along a second slope, however, the voltage level of the first output node Q and the voltage level of the first input node N1 declines following along a third slope due to the pull-down circuit PD is enabled. The third slope is larger (or steep) than the first slope.

From the time t3 to the time t3', the voltage level of the first output node Q, the second output node QB, and the voltage level of the first input node N1 remain unchanged. However, the voltage level of the second input node N2 declines (or decreases) gradually following along a fourth slope. The forth slope is substantially equal to the third slope. In contrast, the voltage level of the second output node QB and the voltage level of the second input node N2 remain unchanged from the time t1 to the time t3.

The voltage difference (or offset) DV between the first input voltage VIN of the first input node N1 and the second input voltage VIN' of the second input node N2 is large enough at a predetermined value to be sensed after the time t2.

The voltage difference DV between the first input node N1 and the second input node N2 which shows the latching behavior is kept at the fixed value from the time t2 to the time t3 and then gradually declines from the time t3 to the time t3'. It is noted that the waveform of the voltage difference DV will not crossover from the time t1 to the time t4. That is, the sense amplifier circuit will not suffer from the influence of the device mismatch and is able to enhance the sensing speed of the sense amplifier circuit 400. Furthermore, the time that the voltage difference DV is kept with the matching capacitor CAP in the sense amplifier 400 is longer than the time that the voltage difference DV is kept without the matching capacitor CAP.

In some embodiments, a sensing method of a sense amplifier circuit 400 includes: receiving a first input voltage VIN of a first input node N1 from a first data line and a second input voltage VIN' of a second input node N2 from a second data line DLB; pre-charging the first input node N1 by a first output voltage of a first output node Q while a control line CL is received a select signal SAE where the sense amplifier circuit is enabled by the select signal SAE and pre-charging a second input node N2 by a second output voltage of the second output node QB while the control line CL is received the select signal SAE where the sense amplifier circuit 400 is enabled by the select signal SAE, wherein a voltage level of the first output node Q is the same as the first input voltage VIN of a first input node N1; discharging the first input voltage VIN of the first input node N1 and the second input voltage VIN' of the second input node N2 by a pull-down circuit PD; keeping a voltage difference DV between the first input voltage VIN of the first input node N1 and the second input voltage VIN' of the second input node N2 at a fixed value by a matching capacitor CAP of the sense amplifier circuit 400 during a sensing period; amplifying a voltage difference DV of the first output node Q and the second output node QB according to the first input voltage VIN of the first input node N1 and the second input voltage VIN' of the second input node N2; and outputting a sensing voltage at an output node of the sense amplifier circuit 400.

During a read operation, the access transistor is enabled as well, and the bit line BL being pre-charged may be pulled up or pulled down according to a charge state of the storage capacitor. In specific, a word line WL coupled to the selected memory cell is asserted, then the pre-charged bit lines BL are further pulled up or pulled down by the storage capacitors of the memory cells coupled to the asserted word line WL, respectively. By comparing the voltage variation of the bit line BL coupled to the selected memory cell with a reference voltage, the charge state of the storage capacitor can be sensed, and the logic state of the memory cell can be identified. By virtue of pulling up/down the pre-charged bit lines BL, the charges stored in the storage capacitors of the memory cells coupled to the asserted word line WL are altered. In order to restore logic states of these memory cells, the read operation may be followed by a write operation for programming the previous logic states to these memory cells, and such write operation may also be referred as a refresh operation.

The memory arrays are routed to the memory control circuit or memory controller lying under the memory arrays. Although not shown, the word lines of the memory array may be routed to the underlying memory controller as well. The memory controller is formed on a surface of a semiconductor substrate (e.g., core die), while the memory arrays are embedded in a stack of interlayer dielectric layers lying over the memory controller.

According to different design needs, the memory control circuit and/or a block of the memory controller may be implemented in the form of hardware, firmware, software (i.e., a program), or a combination of the majority of the foregoing three.

In the form of hardware, the memory control circuit and/or the block of the memory controller may be implemented in the form of a logic circuit on an integrated circuit. Related functions of the memory control circuit and/or the memory controller may be implemented as hardware through using hardware description languages (e.g., Verilog HDL or VHDL) or other suitable programming languages. For instance, the related functions of the memory control circuit and/or the memory controller may be implemented in one or a plurality of controllers, a micro controller, a micro-processor, an application-specific integrated circuit (ASIC), a digital signal processor (DSP), a field programmable gate array (FPGA), and/or various logic blocks, modules, and circuits in other processing units.

In the form of software and/or firmware, the related functions of the memory control circuit and/or the memory controller may be implemented as programming codes. For instance, the memory control circuit and/or the memory controller may be implemented by using a general programming language (e.g., C, C++, or an assembly language) or other suitable programming languages. The programming code may be recorded/stored in a recording medium. In some embodiments, the recording medium includes, for example, read only memory (ROM), random access memory (RAM), and/or a storage device. The storage device includes a hard disk drive (HDD) a solid-state drive (SSD), or other storage devices. In some other embodiments, the recording medium may include a "non-transitory computer readable medium". For instance, a tape, a disk, a card, semiconductor memory, a programmable logic circuit, etc. may be used to be implemented as the non-transitory computer readable medium. A computer, a central processing unit (CPU), a controller, a micro controller, or a micro-processor may read and execute the programming code from the recording medium to accomplish the related functions of the memory control circuit and/or the memory controller. Further, the programming code may also be provided to the computer (or CPU) through any transmission medium (a communication network or a broadcast wave, etc.). The communication network includes, for example, Internet, a wired communication network, a wireless communication network, or other communication media.

The memory controller includes sense amplifiers. The sense amplifiers are configured to facilitate read operations. Each sense amplifier may include two inputs. One of the inputs is coupled to a bit line from the memory array, while the other input is coupled to a bit line from the memory array. During a read operation, both bit lines coupled to the inputs of a sense amplifier are pre-charged to a pre-charging voltage, and one of these bit lines would be further pulled up or pulled down by the storage capacitor in a selected memory cell, while the other bit line still holds at the pre-charging voltage. The sense amplifier is configured to output the logic state of the selected memory cell by comparing the voltage on the bit line coupled to the selected memory cell with the pre-charging voltage held by the other bit line. For instance, when a memory cell in the memory array is selected for a read operation, the bit lines from the memory arrays are pre-charged to a pre-charging voltage. Further, the word line coupled to the selected memory cell is asserted, and the bit line coupled to the selected memory cell is further pulled up or pulled down by the storage capacitor in the selected memory cell. The bit line being further pulled up/down is coupled to an input of one of the sense amplifiers, and another input of this sense amplifier is coupled to a bit line from the memory array. During such read operation, none of the word lines in the memory array is asserted, thus the bit line BL from the memory array is prevented from being further pulled up/down, thus still holds at the pre-charging voltage. This sense amplifier compares the voltage at the bit line BL coupled to the selected memory cell with the pre-charging voltage held by the bit line BL, and identify the logic state of the selected memory cell.

As described above, the sense amplifier circuit in the memory circuit is able to achieve faster read speed. Further, the sense amplifier circuit with a matching capacitor is able to keep the voltage difference, thus the waveform of the voltage difference will not crossover during the positive feedback amplify period due to the device mismatch. Consequently, interference between the adjacent voltages across the matching capacitor in the memory circuits with the sense amplifier circuit can be prevented. That is, the sense amplifier circuit will not suffer from the influence of the device mismatch and easily improves the sensing speed of the sense amplifier circuit in the present application.

As compared to the sense amplifier circuit at the same circuit area that does not have a matching capacitor, the small offset voltage is achieved in the present application.

In some embodiments, the sense amplifier circuit includes a differential amplifier, comprising a first input node, a second input node, a first output node and a second output node, wherein the differential amplifier amplifies a voltage difference of the first output node and the second output node according to a first input voltage of the first input node and a second input voltage of the second input node; a first switch, wherein a control node of the first switch is coupled to a control line, a first node of the first switch is coupled to the first input node, and a second node of the first switch is coupled to the first output node, the first switch is configured to pre-charge the first input node by a first output voltage of the first output node while the control line is received a select signal where the sense amplifier circuit is enabled by the select signal; and a second switch, wherein a control node of the second switch is coupled to the control line, a first node of the second switch is coupled to the second input node, and a second node of the second switch is coupled to the second output node, the second switch is configured to pre-charge the second input node by a second output voltage of the second output node while the control line is received the select signal where the sense amplifier circuit is enabled by the select signal.

In some embodiments, a memory circuit includes a first input node, a second input node, a first output node and a second output node, wherein the differential amplifier amplifies a voltage difference of the first output node and the second output node according to a first input voltage of the first input node and a second input voltage of the second input node; a first switch, wherein a control node of the first switch is coupled to a control line, a first node of the first switch is coupled to the first input node, and a second node of the first switch is coupled to the first output node, the first switch is configured to pre-charge the first input node by a first output voltage of the first output node while the control line is received a select signal where the sense amplifier circuit is enabled by the select signal; and a second switch, wherein a control node of the second switch is coupled to a control line, a first node of the second switch is coupled to the second input nod, and a second node of the second switch is coupled to the second output node, the second switch is configured to pre-charge the second input node by a second output voltage of the second output node while the control line is received the select signal where the sense amplifier circuit is enabled by the select signal; and a matching capacitor, coupled to the first switch and the second switch, wherein the matching capacitor is configured to keep a voltage difference between the first input voltage of the first input node and the second input voltage of the second input node at a fixed value during a sensing period.

In some embodiments, In some embodiments, a sensing method of a sense amplifier circuit includes: receiving a first input voltage of a first input node from a first data line and a second input voltage of a second input node from a second data line; pre-charging the first input node by a first output voltage of a first output node while a control line is received a select signal where the sense amplifier circuit is enabled by the select signal and pre-charging a second input node by a second output voltage of the second output node while the control line is received the select signal where the sense amplifier circuit is enabled by the select signal, wherein a voltage level of the first output node is the same as the first input voltage of a first input node; discharging the first input voltage of the first input node and the second input voltage of the second input node by a pull-down circuit; keeping a voltage difference between the first input voltage of the first input node and the second input voltage of the second input node at a fixed value by a matching capacitor of the sense amplifier circuit during a sensing period; amplifying a voltage difference of the first output node and the second output node according to the first input voltage of the first input node and the second input voltage of the second input node; and outputting a sensing voltage at an output node of the sense amplifier circuit.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A sense amplifier circuit, comprising:
   a differential amplifier, comprising a first input node, a second input node, a first output node and a second output node, wherein the differential amplifier amplifies a voltage difference of the first output node and the second output node according to a first input voltage of the first input node and a second input voltage of the second input node;
   a first switch, wherein a control node of the first switch is coupled to a control line, a first node of the first switch is coupled to the first input node, and a second node of the first switch is coupled to the first output node, the first switch is configured to pre-charge the first input node by a first output voltage of the first output node while the control line is received a select signal where the sense amplifier circuit is enabled by the select signal; and a second switch, wherein a control node of the second switch is coupled to the control line, a first node of the second switch is coupled to the second input node, and a second node of the second switch is coupled to the second output node, the second switch is configured to pre-charge the second input node by a second output voltage of the second output node while the control line is received the select signal where the sense amplifier circuit is enabled by the select signal.

2. The sense amplifier circuit according to claim 1, wherein the differential amplifier further comprises:

an inverter pair, coupled to a power supply, configured to provide positive feedback for voltage latching behavior; and a pull-down circuit, coupled to the differential amplifier, configured to provide a biasing current source to discharge the sense amplifier circuit.

3. The sense amplifier circuit according to claim 1, wherein the differential amplifier further comprises:

a matching capacitor, coupled to the first switch and the second switch, wherein the matching capacitor is configured to keep a voltage difference between the first input voltage of the first input node and the second input voltage of the second input node during a sensing period.

4. The sense amplifier circuit according to claim 1, wherein the first switch further comprises a first pre-charge switch and a first control switch, wherein the first control switch is enabled when the select signal is enabled and a gate node voltage of the first pre-charge switch is at logic low.

5. The sense amplifier circuit according to claim 4, wherein the sense amplifier circuit is configured to detect a voltage difference between the first input node and the second input node in a memory circuit and output a sensing voltage at an output node of the sense amplifier circuit, wherein the memory circuit comprises:

a plurality of memory cells, each comprising at least one access transistor;

a plurality of word lines, respectively coupled to a row of the memory cells; and a plurality of bit lines respectively coupled to a column of the memory cells;

a column decoder for selecting one of plurality of bit lines, coupled to the plurality of bit lines; and a word line decoder for selecting one of plurality of word lines, coupled to the plurality of word lines.

6. The sense amplifier circuit according to claim 5, wherein the inverter pair further comprises:

a third switch and a fifth switch, respectively coupled to the first pre-charge switch and a second pre-charge switch, the first control switch and a second control switch, and a first input switch and a second input switch; and a fourth switch and a sixth switch, coupled to the power supply, respectively coupled to the first pre-charge switch and the second pre-charge switch, wherein the first pre-charge switch is coupled to the first data line and the first input switch, wherein a gate node of the first pre-charge switch is coupled to a gate node of the first control switch, and a controller determines whether a first bit line voltage is transmitted through the control line to the first input node by a voltage level of the select signal, and wherein the voltage level of the first input voltage of the first input node is complementary to an output voltage of the first output node.

7. The sense amplifier circuit according to claim 6, wherein the first control switch receives the select signal through the gate node of the first control switch from the controller and receives the first bit line voltage through a drain node of the first control switch.

8. The sense amplifier circuit according to claim 7, wherein the first pre-charge switch transfers the first bit line voltage to a drain node of the third switch, and wherein the second pre-charge switch transfers a second bit line voltage to a drain node of the fifth switch.

9. The sense amplifier circuit according to claim 8, wherein the source node of the third switch is coupled to the first input node and the source node of the fifth switch is coupled to the second input node.

10. The sense amplifier circuit according to claim 8, wherein a voltage level of the source node of the third switch and a voltage level of the source node of the fifth switch are respectively pre-charged to a first voltage level and a second voltage level, and wherein the first voltage level is complementary to the second voltage level.

11. The sense amplifier circuit according to claim 4, wherein the first pre-charge switch and the first control switch are PMOS transistors.

12. The sense amplifier circuit according to claim 6, wherein the first input switch and the second input switch respectively receive the first bit line voltage and the second bit line voltage from the plurality of bit lines selected by the column decoder.

13. The sense amplifier circuit according to claim 6, wherein a voltage difference between the first input switch and the second input switch is detected by the sense amplifier when the voltage difference reaches a predetermined voltage difference.

14. The sense amplifier circuit according to claim 1, wherein a voltage difference between the first input node and the second input node decreases gradually during a sensing period.

15. The sense amplifier circuit according to claim 1, wherein a voltage level of the second bit line voltage is complementary to the first bit line voltage.

16. The sense amplifier circuit according to claim 15, wherein the first input voltage of the first input node and the second input voltage of the second input node are complement.

17. A memory circuit, comprising:

a differential amplifier, comprising a first input node, a second input node, a first output node and a second output node, wherein the differential amplifier amplifies a voltage difference of the first output node and the second output node according to a first input voltage of the first input node and a second input voltage of the second input node;

a first switch, wherein a control node of the first switch is coupled to a control line, a first node of the first switch is coupled to the first input node, and a second node of the first switch is coupled to the first output node, the first switch is configured to pre-charge the first input node by a first output voltage of the first output node while the control line is received a select signal where the sense amplifier circuit is enabled by the select signal; and a second switch, wherein a control node of the second switch is coupled to a control line, a first node of the second switch is coupled to the second input node and a second node of the second switch is coupled to the second output node, the second switch is configured to pre-charge the second input node by a second output voltage of the second output node while the control line is received the select signal where the sense amplifier circuit is enabled by the select signal; and a matching capacitor, coupled to the first switch and the second switch, wherein the matching capacitor is configured to keep a voltage difference between the first input voltage of the first input node and the second input voltage of the second input node at a fixed value during a sensing period.

18. The memory circuit according to claim 17, wherein the second switch further comprises a second pre-charge switch and a second control switch, wherein the second control switch is enabled when the select signal is enabled and a gate node voltage of the second pre-charge switch is at logic low.

19. The memory circuit according to claim 18, wherein the voltage difference between the first input voltage of the first input node and the second input voltage of the second input node becomes smaller than the fixed value after the sensing period.

20. A sense amplifier circuit, comprising:

a differential amplifier, comprising a first input node, a second input node, a first output node and a second output node, wherein the differential amplifier amplifies a voltage difference of the first output node and the second output node according to a first input voltage of the first input node and a second input voltage of the second input node;

a first switch, wherein a first node of the first switch is coupled to the first input node, and a second node of the first switch is coupled to the first output node; and a second switch, wherein a first node of the second switch is coupled to the second input node, and a second node of the second switch is coupled to the second output node, wherein the first switch pre-charges the first input node by a first output voltage of the first output node in response to a select signal received by a control node of the first switch, and wherein the second switch pre-charges the second input node by a second output voltage of the second output node in response to the select signal received by a control node of the second switch.

\* \* \* \* \*